(12) United States Patent
Leung

(10) Patent No.: US 10,962,570 B2
(45) Date of Patent: Mar. 30, 2021

(54) SYSTEM, A TANGENT PROBE CARD AND A PROBE HEAD ASSEMBLY FOR TESTING SEMICONDUCTOR WAFER

(71) Applicant: Wing Cheuk Leung, Kowloon (HK)

(72) Inventor: Wing Cheuk Leung, Kowloon (HK)

( * ) Notice: Subject to any disclaimer, the term of this patent is extended or adjusted under 35 U.S.C. 154(b) by 0 days.

(21) Appl. No.: 16/891,682

(22) Filed: Jun. 3, 2020

(65) Prior Publication Data
US 2020/0363453 A1    Nov. 19, 2020

Related U.S. Application Data

(63) Continuation of application No. 15/654,248, filed on Jul. 19, 2017, now abandoned.

(30) Foreign Application Priority Data

Jul. 21, 2016 (CN) .......................... 201620773769.1

(51) Int. Cl.
| | |
|---|---|
| *G01R 1/073* | (2006.01) |
| *G01R 31/28* | (2006.01) |
| *G01R 1/067* | (2006.01) |
| *H01L 23/00* | (2006.01) |
| *H01R 13/02* | (2006.01) |
| *H01L 21/48* | (2006.01) |

(52) U.S. Cl.
CPC ..... *G01R 1/07364* (2013.01); *G01R 1/06733* (2013.01); *G01R 1/06738* (2013.01); *G01R 31/2886* (2013.01); *H01L 21/4814* (2013.01); *H01L 24/01* (2013.01); *H01R 13/02* (2013.01)

(58) Field of Classification Search
CPC ............ G01R 1/07364; G01R 1/06738; G01R 31/2886; G01R 1/06733; H01L 21/4814; H01L 24/01; H01R 13/02
USPC ....................................................... 324/750.19
See application file for complete search history.

(56) References Cited

U.S. PATENT DOCUMENTS

| | | | | |
|---|---|---|---|---|
| 5,389,873 A * | 2/1995 | Ishii | ................... | G01R 1/07314 324/750.03 |
| 5,521,519 A * | 5/1996 | Faure | ................. | G01R 1/06711 324/72.5 |
| 5,656,942 A * | 8/1997 | Watts | ................. | G01R 1/06705 324/750.19 |
| 6,066,957 A * | 5/2000 | Van Loan | .......... | G01R 1/07328 324/750.19 |
| 6,369,593 B1 * | 4/2002 | Ott | ..................... | G01R 31/2808 324/750.17 |

(Continued)

*Primary Examiner* — Christopher P McAndrew
(74) *Attorney, Agent, or Firm* — Muncy, Geissler, Olds & Lowe, P.C.

(57) ABSTRACT

A system for semiconductor wafer testing, a tangent probe card and a probe head assembly thereof. The system has a tangent probe card and a tester. Testing ends of the probe card are flat, hence the allowable alignment budget will always be more generous for the tangent probe card. The probes are held on the probe head assembly, and once the alignment is achieved accurately during manufacture, the alignment will remain stable throughout the whole life cycle. The probe has a greater CCC due to its larger cross section. The throughput of the tangent probes is higher than that of the conventional probe card since there is no need to move the pointed pin/structure. No pointed pin/structure needs to be repaired, and the flat bottom surface of the probe head assembly is easier to clean and maintain.

19 Claims, 12 Drawing Sheets

(56) References Cited

U.S. PATENT DOCUMENTS

| | | | | |
|---|---|---|---|---|
| 6,626,682 B2* | 9/2003 | Sausen | G01R 1/0466 | 324/750.19 |
| 7,057,410 B1* | 6/2006 | Wohlfarth | G01R 31/2889 | 324/750.25 |
| 10,082,524 B2* | 9/2018 | Miyazono | G01R 1/06711 | |
| 2003/0048108 A1* | 3/2003 | Beaman | G01R 31/2886 | 324/755.11 |
| 2004/0207423 A1* | 10/2004 | Mizoguchi | G01R 31/2808 | 324/750.19 |
| 2007/0145992 A1* | 6/2007 | Akahori | G01R 31/2893 | 324/750.19 |
| 2008/0094081 A1* | 4/2008 | Nguyen | G09G 3/006 | 324/750.19 |
| 2008/0309359 A1* | 12/2008 | Eldridge | G01R 1/0466 | 324/750.19 |
| 2009/0058445 A1* | 3/2009 | Leon | H05K 1/0268 | 324/757.02 |
| 2010/0001748 A1* | 1/2010 | Sasaki | G01R 31/2889 | 324/754.07 |
| 2010/0029099 A1* | 2/2010 | Hamada | G01R 1/0735 | 439/66 |
| 2010/0066396 A1* | 3/2010 | Miura | G01R 31/2889 | 324/757.01 |
| 2012/0249173 A1* | 10/2012 | Hamel | H01L 21/76885 | 324/755.01 |
| 2013/0207683 A1* | 8/2013 | Tanaka | H01R 12/714 | 324/756.03 |
| 2014/0062516 A1* | 3/2014 | Rashidzadeh | G01R 31/2889 | 324/750.19 |
| 2014/0210501 A1* | 7/2014 | Root | G01R 1/07364 | 324/750.19 |
| 2014/0347084 A1* | 11/2014 | Hu | G01R 31/2891 | 324/754.11 |
| 2015/0008946 A1* | 1/2015 | Inoue | G01R 1/07342 | 324/750.03 |
| 2016/0341790 A1* | 11/2016 | Thompson | G01R 31/2889 | |

* cited by examiner

SYSTEM, A TANGENT PROBE CARD AND A PROBE HEAD ASSEMBLY FOR TESTING SEMICONDUCTOR WAFER

CROSS REFERENCE TO RELATED APPLICATIONS

This nonprovisional application is a continuation of U.S. application Ser. No. 15/654,248 filed on Jul. 19, 2017, which claims priority under 35 U.S.C. § 119(a) to Chinese Utility Model Application No. 201620773769.1, which was filed on Jul. 21, 2016, and which are both herein incorporated by reference.

FIELD OF THE UTILITY MODEL

The utility model relates to the technical field of semiconductor testing, and particularly, relates to a system for semiconductor wafer testing, a tangent probe card and a probe head assembly thereof.

BACKGROUND OF THE UTILITY MODEL

It is traditional, in the technical field of semiconductor wafer testing, to utilize a probe card as an interface between a tester and a semiconductor wafer. As shown in FIG. 1, traditional probe cards, such as cantilever-type probe cards, vertical probe cards, or MEMS (micro-electro-mechanical system) probe cards, usually contact the surface of a wafer 40 via a pointed pin/structure (as a pointed probe 110' in FIG. 1). In testing semiconductor wafer, the contact surface of the wafer may be solder bump, Cu pillar, and Si through-holes. With the development of the treatment technologies of wafer, the wafer contact surface will become smaller and smaller. For example, the diameter of the Cu pillar will decrease from 70 μm or so to 30 μm. Therefore, the size of the probe should be decreased accordingly. This confronts the traditional testing methods with many challenges, such as:

alignment of the probe tip with the test target. During probing, it is crucial to align the probe tip with the test target. For example, if the probe tip 111' fails to reach the top center of the Cu pillar 400 during touchdown, the resulting shear force applied onto the stress point may create fracture to the pillar. With the development of the technologies, the allowable alignment budget between the probe tip and the contact surface will decrease as the probe pitch and the diameter thereof shrunk.

alignment stability of the probe tip. When the diameter of the probe is decreased, the probe will be weakened and become more subjected to deform during probing. A poor alignment will directly affect the performance of the probe card.

current carrying capability of the probe. The transient current may be significantly higher in the case of a finer pitch.

throughput of probe card assemblies. Generally, it is more laborious to handle a finer probe tip and may be likely to increase the manufacturing time.

maintenance and repair of the probe. A finer probe is more prone to breakdown during handling and probing, such that the frequency of maintenance and repair will be increased.

BRIEF SUMMARY OF THE UTILITY MODEL

In view of the challenges mentioned above, the present utility model provides a system for testing semiconductor wafer, a tangent probe card and a probe head assembly thereof. The said system, the said tangent probe card and the said probe head assembly can solve the abovementioned challenges.

On the one hand, one embodiment according to the utility model provides a probe head assembly. The said probe head assembly may comprise: a plurality of probes, one end of each of which is a testing end, the other end of each of which is a connecting end, with the testing ends being flat; and a probe holding portion, which holds the plurality of probes at the prescribed locations, and makes the testing ends of the plurality of probes be flush or leveled with the bottom surface of the probe holding portion.

On the other hand, another embodiment according to the utility model provides a tangent probe card. The tangent probe card has a probe head assembly, wherein the probe head assembly may comprise: a plurality of probes, one end of each of which is a testing end, the other end of each of which is a connecting end, with the testing ends being flat; and a probe holding portion, which holds the plurality of probes at the prescribed locations, and makes the testing ends of the plurality of probes be flush or leveled with the bottom surface of the probe holding portion.

On the further other hand, one further embodiment according to the utility model provides a system for semiconductor wafer testing. The system comprises the said tangent probe card as described herein and a tester, which is electrically connected to the tangent probe card, wherein the tangent probe card is used to contact and test the test target, and the tester functions to determine the electrical characteristics of the test target according to the electrical signals detected by the tangent probe card. The tangent probe card is provided with a probe head assembly, which probe head assembly may comprise: a plurality of probes, one end of each of which is a testing end, the other end of each of which is a connecting end, with the testing ends being flat; and a probe holding portion, which holds the plurality of probes at the prescribed locations, and makes the testing ends of the plurality of probes be flush or leveled with the bottom surface of the probe holding portion.

The said system, the said tangent probe card and the said probe head assembly have the following advantages.

Different from the conventional probe cards, the testing ends (i.e., the tip of the probe) of the tangent probe card are flat, and the diameter of the testing end is usually larger than that of the test target (i.e., the contact surface of the test target), hence the allowable alignment budget is usually more generous for the tangent probe card.

Furthermore, the tangent probes are held on the probe holding portion of the probe head assembly, hence once the alignment is achieved accurately during manufacture, the alignment will remain stable throughout the whole life cycle.

As compared to the conventional pointed probe, the tangent probe has a greater CCC due to its larger cross section. Therefore, for the test target of the same size, the tangent probe has a greater CCC than the conventional probe card.

The throughput of the tangent probe card according to the present utility model is higher than that of the conventional vertical probe cards or MEMS probe cards since there is no need to move the pointed pin/structure.

In addition, since no pointed pin/structure needs to be repaired for the tangent probe card, and the flat bottom surface of the probe head assembly is easier to clean and maintain, the frequency of maintain and repair is very low.

Figure 1:
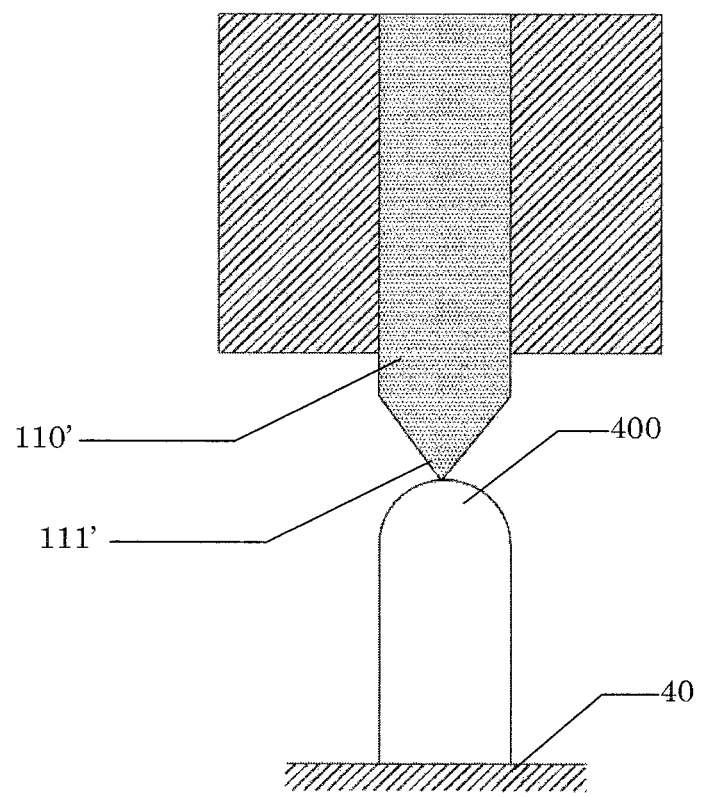
FIG. 1 is a cross-sectional view illustrating wafer testing via a traditional probe card.

In the figures:
10: tangent probe card
20: tester
40: test target (or wafer)
100: probe head assembly
200: holder
300: buffer part
400: Cu pillar
110: probe
120: probe holding portion
111: testing end
112: connecting end
121: main body part
122: peripheral part
123: through-hole
124: mounting hole
210: upper holding block
220: lower holding block
201: top opening
202: bottom opening
211: upper fixing hole
212: mounting hole
221: lower fixing hole
310: elastic ring
320: spring
110': pointed probe
111': probe tip

DETAILED DESCRIPTION

Aspects of the utility model will be thoroughly described with reference to the accompanying drawings and specific embodiments. It should be noted that the accompanying drawings are not necessarily to the scale. The main function of these figures is to illustrate the principle of the utility model. In all figures, the same reference number refers to the same component, the repetitive description thereof is therefore omitted.

In various embodiments according to the utility model, well-known structures, materials, and operations are not shown or explained. The features, structures or characteristics in the descriptions can be combined in any suitable way in one or more embodiments. It should be appreciated by the skilled one that the following embodiments are illustrative only, and therefore will not limit the scope of the utility model. It should also be appreciated that based on the teaching herein, components or parts in the embodiments as shown in the accompanying figures or as described herein can be designed or configured in a plurality of ways.

A Probe Head Assembly

Figure 2:
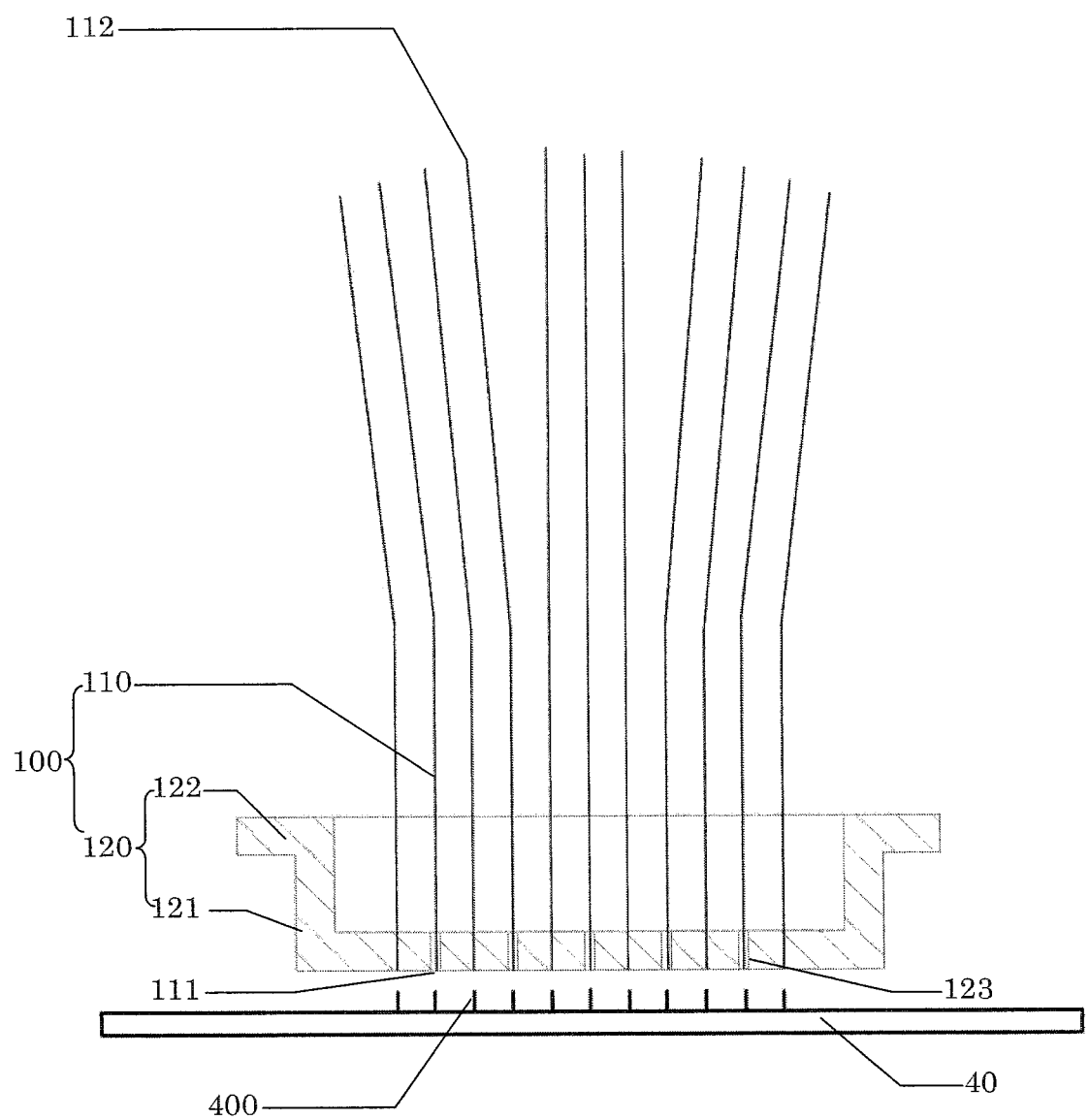
FIG. 2 is a cross-sectional view illustrating wafer testing via a probe head assembly according to an embodiment of the utility model.
Figure 3:
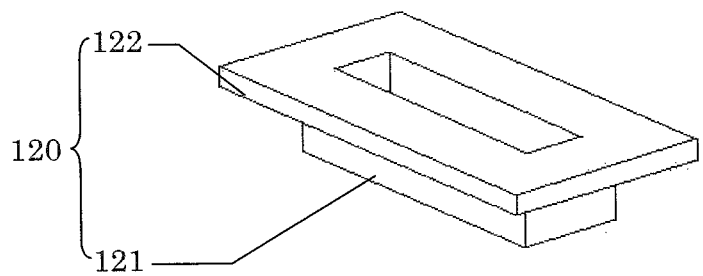
FIG. 3 is a perspective view of the probe holding portion of the probe head assembly as shown in FIG. 2.
Figure 4:
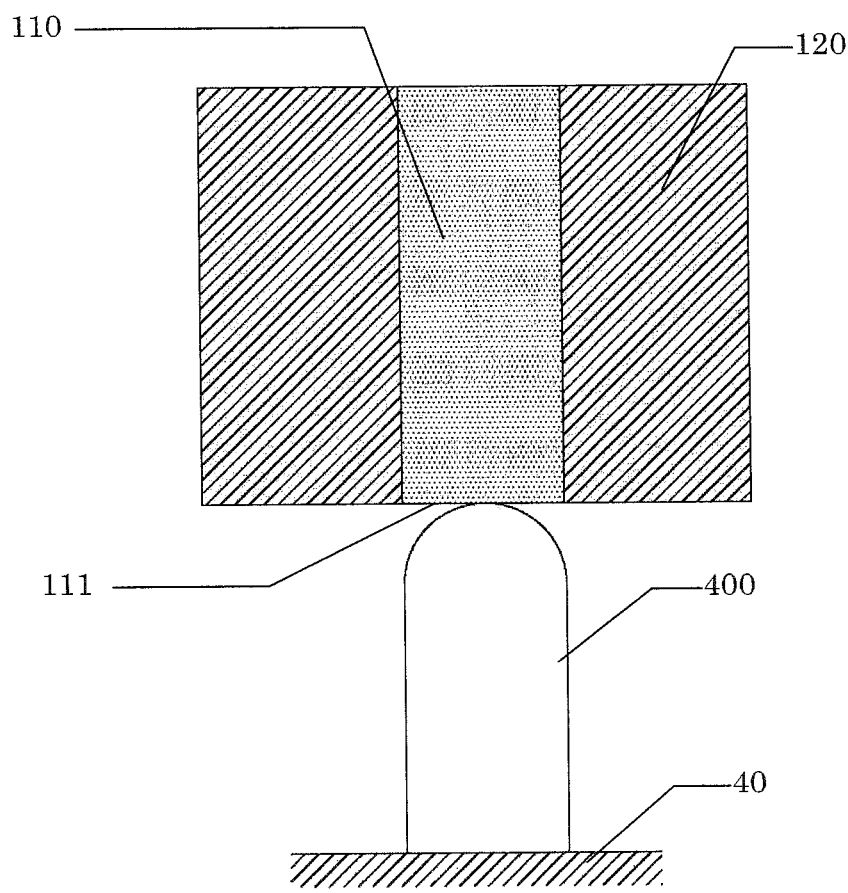
FIG. 4 is a cross-sectional view illustrating wafer testing via any one of the tangent probes of the probe head assembly as shown in FIG. 2.

The probe head assembly of the utility model is utilized in the probe card as the interface between the tester and the semiconductor wafer, to hold the probe, so as to make a contact with the wafer (the test target) during probing. In this way, wafer testing is performed. The detailed description will be made hereinafter with reference to FIGS. 2-4. FIG. 2 is a cross-sectional view illustrating wafer testing via a probe head assembly according to an embodiment of the utility model. FIG. 3 is a perspective view of a probe holding portion of the probe head assembly as shown in FIG. 2. FIG. 4 is a cross-sectional view illustrating wafer testing via any one of the tangent probes of the probe head assembly as shown in FIG. 2, wherein the location relation between the probe and the wafer surface is detailedly shown.

Refer to FIG. 2, which shows wafer testing via a probe head assembly according to an embodiment of the utility model. In the embodiment of the utility model, the probe head assembly 100 may comprises, but not limited to, a plurality of probes 110 and a probe holding portion 120. One end of the said probe 110 is a testing end 111. The other end of the probe 110 is a connecting end 112. The testing end 111 is flat. Specifically, the end surface of the testing end 111 is a flat plane. The said connecting end 112 is used to connect with the tester electrically. In one embodiment according to the utility model, the probe 110 is electrically connected to the tester via a conductive wire. In this situation, the connecting end 112 is electrically connected to the tester via a conductive wire. Alternatively, in another embodiment according to the utility model, the probe 110 is a part of the conductive wire that is electrically connected to the tester. In other words, the probe 110 and the conductive wire are one piece, and the probe 110 is an extensive part (or the continuation) of the conductive wire. In this case, the end of the conductive wire that is connected to the tester is the connecting end 112, and the other end of the conductive wire is the testing end 111. In various different embodiments of the utility model, the probe holding portion 120 holds the plurality of probes 110 at the prescribed location, and makes the testing ends 111 of the plurality of probes 110 be flush (or leveled) with the bottom surface of the probe holding portion 120, which will be detailedly described hereinafter.

In one embodiment of the utility model, as shown in FIG. 2-3, the probe holding portion 120 may comprise a main body part 121 and a peripheral part 122. The said main body part 121 is a cavity through which the plurality of probes can go through. For example, the main body part 121 is configured as a container with an opening at one end thereof to accommodate the plurality of probes 110 therein. Specifically, the top of the main body part 121 is open, so as to allow the connecting ends 112 of the plurality of probes 110 to be connected with the tester, and the bottom of the main body part 121 is provided with a plurality of through-holes 123. The testing ends 111 of the plurality of probes 110 extend into the through-holes 123 such that the testing ends are flush with the bottom surface of the main body part 121 (i.e., the bottom surface of the probe holding portion). In this way, the plurality of probes 110 are held in the corresponding through-holes 123, and the testing ends 111 are flush with the bottom surface of the probe holding portion 120. The location of plurality of probes 110 are usually determined according to the locations of the solder bumps (for example, a Cu pillar) on the test target. During manufacturing the probe card or the probe head assembly, the locations of the probes are usually determined according to the layout information of the solder bumps, the engagement pattern, the pitch of the solder bumps, and the size of the solder bumps, and hence the layout of the through-holes in the probe holding portion is determined. The location of the probe is usually aligned with the center of the solder bump, and the size of the probe is limited by the size of the solder bump. Based on all these considerations, the size and the location of the through-holes in the probe holding portion can be determined. As shown in FIG. 2, the testing ends of the plurality of probes 110 are aligned with a plurality of Cu pillars 400 on the wafer 40. Additionally, in various embodiments of the utility model, the peripheral part 122 of the probe holding portion 120 is located at the top peripheral area of the main body part 121, and specifically in this embodiment, is located at the open side of the main body part 121, and is connected to the main body part 121. In some embodiments of the utility model, the peripheral part 122 is weld with the main body part 121. In other embodiments of the utility model, the peripheral part 122 and the main body part 121 may be bonded together via adhesive. Therefore, the skilled one in the art should appreciate that the utility model is not limited thereto, and the peripheral part 122 can be connected to the main body part 121 in various ways. For example, various means of mechanical fitting, such as friction fitting, embed fitting and key joint, can be utilized to connect the peripheral part 122 to the main body part 121. For example, the edge of the open side of the main body part 121 is provide with a groove, and the inner side of the peripheral part 122 is provided with a flange. The flange can be embedded into the groove so as to fulfill connection via an interference fit. Additionally, the peripheral part 122 and the main body part 121 may be integrated via injection molding, for example. Additionally, in other embodiments of the utility model, the main body part of the probe holding portion has no opening at the top side, instead, and similar as the bottom, is provided with through-holes for a plurality of probes to go through. In this way, the peripheral part may be dispensed with.

In an embodiment of the utility model, as shown in FIG. 3, the probe holding portion 120 is configured as a tank-type rectangular parallelepiped container with a flange. However, the utility model is not limited to such embodiment. The shape of the probe holding portion can be determined according to the practical requirements. For example, it can be determined according to the shape of the test target, or to the layout of the solder bump. For example, the probe holding portion may be a cylindrical tank-type container.

The operation process and the advantages of the probe head assembly 100 according to the utility model will be described with reference to FIG. 4. For the sake of clarity, FIG. 4 illustrates a probe 110 in FIG. 2 in an enlarged view. During probing, the probe head assembly 100 moves downward, under the control of the tester, to the extent that the test ends 111 of the probes 110 make a contact with the Cu pillar 400, so as to test the electrical characteristics of the wafer 40. Different from the pointed probe as shown in FIG. 1, the testing end 111 (i.e., the probe tip) of the probe 110 is flat, and is flush with the bottom of the probe holding portion 120. In this way, the diameter of the testing end 111 is usually greater than that of the Cu pillar 401. Therefore, the allowable alignment budget for the probe 110 is usually more generous than otherwise. In addition, the plurality of tangent probes 110 according to the present utility model are held on the probe holding portion 120 of the probe head assembly 100. In this way, once the alignment is achieved accurately during manufacture, the alignment will remain stable in the whole life cycle. In addition, as compared to the conventional pointed probes, the tangent probe 110 has a greater CCC (current carrying capacity) due to its larger circular cross section. In this way, as to the test target of the same size, CCC of the tangent probe is larger than that of the conventional probe. In addition, the throughput of the tangent probes of the probe head assembly 100 according to the utility model is higher than that of the conventional vertical probe cards or MEMS probe cards since there is no need to move the pointed pin/structure. Furthermore, since no pointed pin/structure needs to be repaired for the probe head assembly 100, the flat bottom surface of the probe head assembly 100 is easier to clean and maintain, the maintenance and repair frequency thereof is decreased, leading to a lower cost.

A Tangent Probe Card

During semiconductor wafer testing, the tangent probe card is utilized as the interface between the tester and the wafer. The tangent probe card according to the present utility model has a probe head assembly as described in the above-mentioned embodiments. Since the testing end of the probe of the probe head assembly is flat and is flush with the bottom surface of the probe holding portion, the tangent probe card with the said probe head assembly can deal with the challenges confronted with the conventional probe cards. The tangent probe card according to the present utility model will be detailedly described with reference to FIGS. 5-16 hereinafter.

First Embodiment

Figure 5:
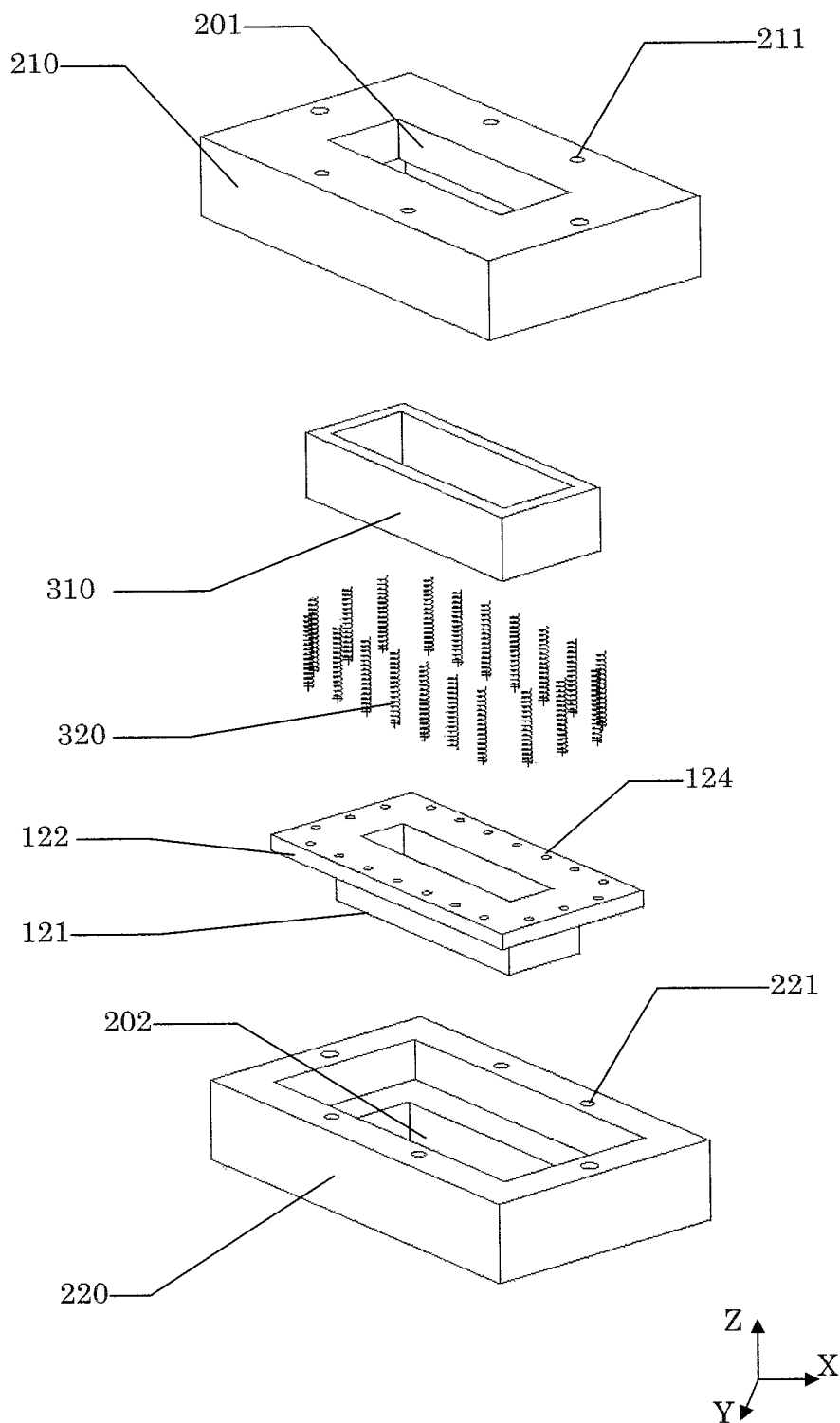
FIG. 5 is a perspective exploded view illustrating the first embodiment of the tangent probe card according to the utility model, where the plurality of probes are omitted for the sake of brevity.
Figure 6:
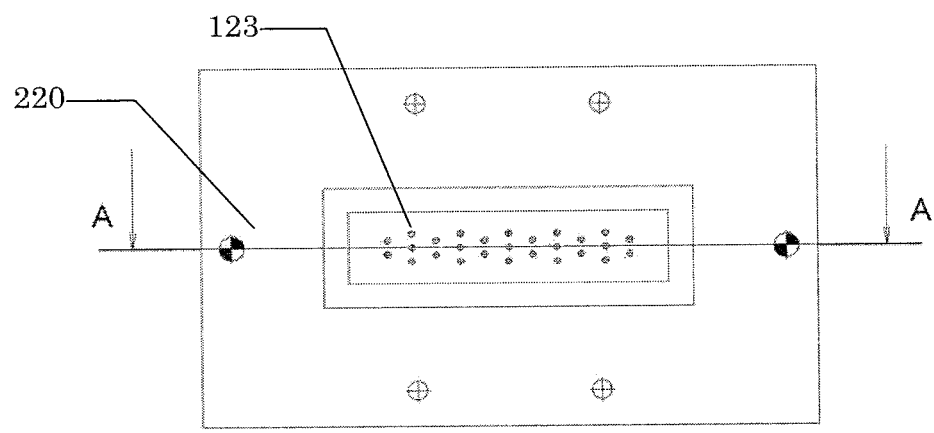
FIG. 6 is a bottom view illustrating the tangent probe card according to the first embodiment.
Figure 7:
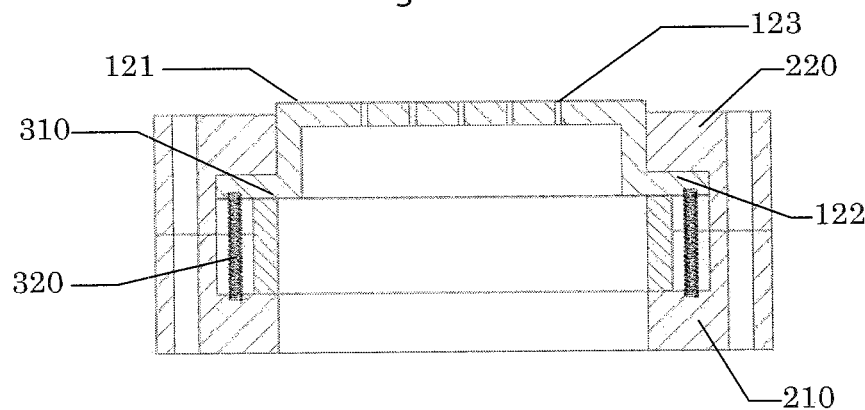
FIG. 7 is a cross-sectional view taken along the line A-A in FIG. 6.
Figure 8:
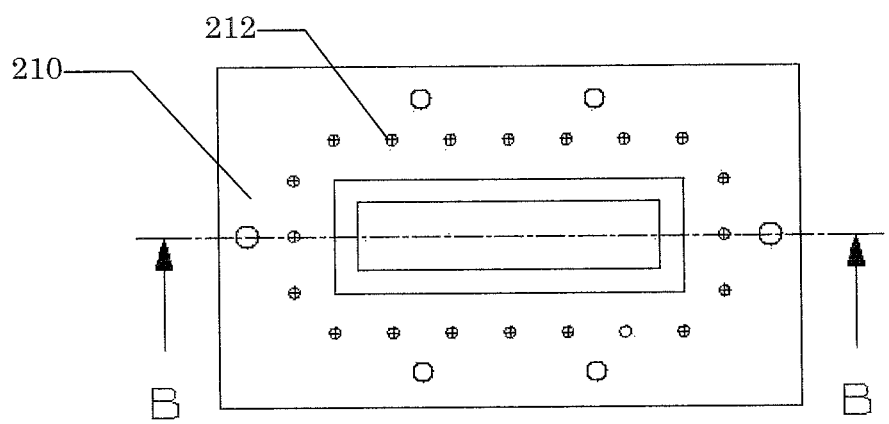
FIG. 8 is a top view illustrating the tangent probe card according to the first embodiment.
Figure 9:
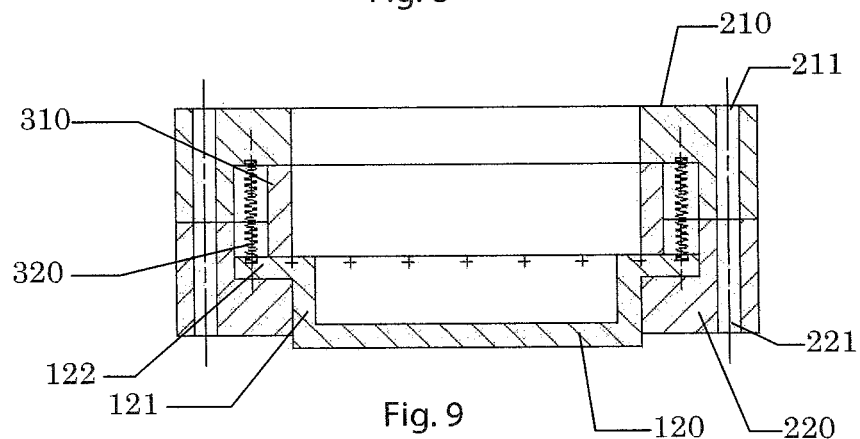
FIG. 9 is a cross-sectional view taken along the line B-B in FIG. 8.
Figure 10:
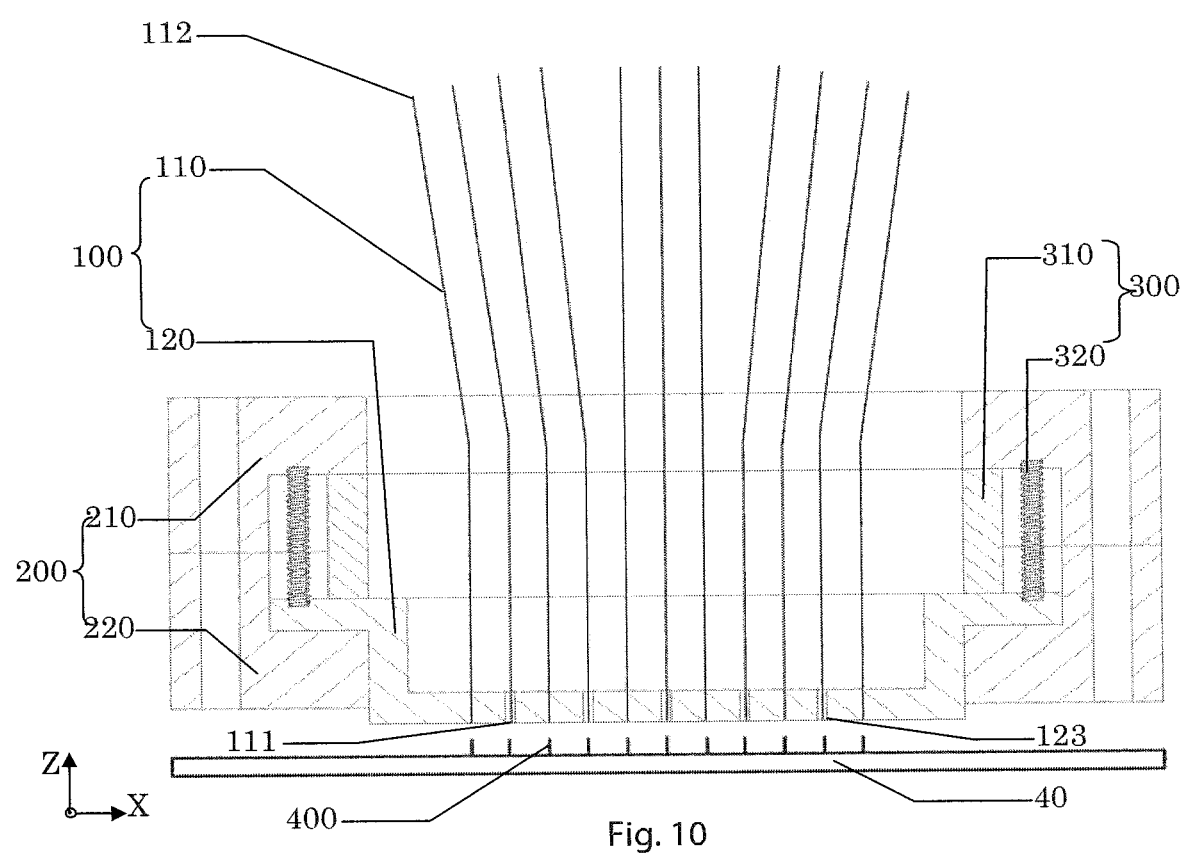
FIG. 10 is a cross-sectional view illustrating wafer testing via the tangent probe card according to the first embodiment.

FIG. 5 is a perspective exploded view illustrating the first embodiment of the tangent probe card according to the utility model, where the plurality of probes are omitted for the sake of brevity. FIG. 6 is a bottom view of the tangent probe card according to the first embodiment. FIG. 7 is a cross-sectional view taken along the line A-A in FIG. 6. FIG. 8 is a top view of the tangent probe card according to the first embodiment, wherein the mounting hole of the upper holding block used to mount the spring is illustrated in a perspective view to show the location of the spring on the upper holding block. FIG. 9 is a cross-sectional view taken along the line B-B in FIG. 8, wherein "+" is utilized to denote the location of the spring behind the elastic ring since the spring is blocked by the elastic ring. Furthermore, the through-holes of the probe holding portion are not presented for the sake of clarity. FIG. 10 is a cross-sectional view illustrating wafer testing via the tangent probe card according to the first embodiment, which particularly shows the location relation between the probe of the tangent probe card and the wafer.

In the first embodiment, the tangent probe card may comprise, but not limited to, a probe head assembly 100, a holder 200 and a buffer part 300. The holder 200 is configured to hold or carry or support the probe head assembly 100. In an embodiment of the present utility model, the holder 200 is configured as a container with openings on the top and the bottom thereof, respectively. Specifically, the holder 200 has an inner space to receive the probe head assembly 100, a bottom opening 202 to allow the probe head assembly 100 to contact the test target, and a top opening 201 to allow the probes of the probe head assembly 100 to connect to the tester electrically. In one embodiment of the present utility model, the holder 200 is configured such that the size of the inner space thereof only allows the movement of the probe head assembly 100 in the vertical direction (i.e., Z direction), but does not allow its movement in the horizontal direction (i.e., X direction and Y direction). In one embodiment of the present utility model, the buffer part 300 is located between the probe head assembly 100 and the holder 200. The buffer part 300 can absorb the impulse or thrust from the probe head assembly 100 during operation, so as to function as an absorber.

In the first embodiment, as shown in FIG. 10, the probe head assembly 100 may comprise a plurality of probes 110 and a probe holding portion 120. The one end of the probe 110 is a testing end 111, and the other end of the probe 110 is connecting end 112. The testing end 111 is flat. The said connecting end 112 is used to connect to the tester electrically. In one embodiment of the utility model, the plurality of probes 110 are electrically connected to the tester via conductive wires. In such a way, the connecting end 112 is electrically connected to the tester via conductive wires. Alternatively, in another embodiment according to the utility model, the probe 110 is a part of the conductive wire that is electrically connected to the tester. In other words, the probe 110 and the conductive wire are one-piece, and the probe 110 is an extensive part (or the continuation) of the conductive wire. In this way, one end of the conductive wire connected to the tester is the connecting end 112, and the other end of the conductive wire is the testing end 111. In various different embodiments of the present utility model, the probe holding portion 120 holds the plurality of probes 110 at the prescribed locations, and makes the testing ends 111 of the plurality of probes 110 be flush with the bottom surface of the probe holding portion 120, which will be detailedly described hereinafter.

As shown in FIG. 5, 6, 10, the probe holding portion 120 may comprise a main body part 121 and a peripheral part 122. The peripheral part 122 is located at the open side of the main body part 121, and is connected to the main body part 121. The main body part 121 is configured as a container with an opening at one end thereof so as to accommodate the plurality of probes 110 therein. Specifically, the top of the main body part 121 is open to allow the connecting ends 112 of the plurality of probes 110 to be connected to the tester, and the bottom there of is provided with a plurality of through-holes 123 to hold the plurality of probes 110 therein.

Furthermore, the testing ends 111 of the plurality of probes 110 are flush with the bottom surface of the main body part 121. In this way, the probe holding portion holds the plurality of probes 110 at the prescribed locations, and makes the testing ends 111 of the plurality of probes 110 be flush with the bottom surface of the probe holding portion 120. The location of plurality of probes 110 are usually determined according to the locations of the solder bump (for example, a Cu pillar) on the test target. During manufacturing the probe card, the locations of the probes are usually determined on the basis of the layout information of the solder bumps, the engagement pattern, the pitch of the solder bumps, and the size of the solder bumps, and hence the layout of the through-holes in the probe holding portion is determined. The location of the probe is usually aligned with the center of the solder bump, and the size of the probe is limited by the size of the solder bump. Based on all these considerations, the size and the location of the through-holes in the probe holding portion can be determined. As shown in FIG. 10, the testing ends 111 of the plurality of probes 110 are aligned with a plurality of Cu pillars 400 of the wafer 40.

In the first embodiment, as shown in FIG. 5 and FIG. 10, the holder 200 is rectangular parallelepiped, and may comprise, but not limited to, an upper holding block 210 with a top opening 201, and a lower holding block 220 with a bottom opening 202. The upper holding block 210 and the lower holding block 220 define an inner space for accommodating the probe head assembly 100. In one embodiment of the utility model, the upper holding block 210 has six upper fixing holes 211, wherein there are located two upper fixing holes 211 at each of the two long sides of the rectangle, and there is located one upper fixing hole at each of the two short sides of the rectangle. The lower holding block 220 as well has six lower fixing holes 221, and the locations of the lower fixing holes 221 in the lower holding block 220 are respectively corresponding to the locations of the upper fixing holes 211 in the upper holding block 210. As shown in FIG. 9, when the upper holding block 210 and the lower holding block 220 are aligned with each other, the upper fixing holes 211 and the lower fixing holes 221 are also aligned with each other, and hence form a passage. In this way, the upper holding block 210 and the lower holding block 220 can be fixed via inserting a fastener into the upper fixing holes 211 and the lower fixing holes 221. The said fastener may be a bolt and a nut. Of course, the utility model is not limited to the specific embodiment. Other means well-known in the art may also be utilized to fix the upper holding block and the lower holding block. For example, the upper fixing hole and the lower fixing hole may be threaded holes, and the fastener may be a bolt with thread. The bolt is screwed into the upper fixing holes and the lower fixing holes, with the thread on the bolt being engaged with the thread on the inner wall of the threaded hole. In this way, the upper holding block and the lower holding block can be fixed. Meanwhile, there is no limits on the number or the arrangement of the holes. There may be two holes, only if they are in a symmetrical layout. For example, the fixing holes on the long sides may be dispensed with, or the fixing holes on the short sides may be dispensed with. Alternatively, there may be one fixing hole on each long side, and so on. Additionally, as shown in FIGS. 7, 9 and 10, the inner space of the holder 200 matches the peripheral part 122 of the probe holding portion 120. Specifically, the profile shape of the peripheral part 122 substantially matches that of the inner space of the holder 200. That is, the length and the width of the inner space of the holder 200 are sized such that the peripheral part 122 can be accommodated therein, and the bottom of the peripheral part 122 abuts against the upper surface of the bottom of the lower holding block 220 of the holder 200. Meanwhile, the profile shape of the main body part 121 substantially matches that of the bottom opening of the holder 200. The length and the width of the bottom opening are sized such that the main body part 121 can be accommodated in the bottom opening exactly. In this way, the holder 200 prevents the probe head assembly 100 with the probe holding portion 120 from moving in the X and Y directions. Meanwhile, the height of the inner space of the holder 200, that is, its size in the Z direction, is greater than the thickness of the probe holding portion 120, such that the probe head assembly 100 with the probe holding portion 120 may move in the Z direction in the inner space. Therefore, the probe head assembly 100 may move in the Z direction during probing, such that the testing ends 111 on the bottom thereof may contact or separate from the wafer surface (e.g., the Cu pillar 400). In this way, the wafer testing is carried out. It is noted that the skilled in the art should appreciate that the shapes and the sizes of the probe holding portion and the holder are not limited to the above-mentioned embodiments. Any configuration in which the probe holding portion (or the probe head assembly) is allowed to move in the Z direction but is not allowed to move in the X and Y directions is applicable to the present utility model.

In the first embodiment, as shown in FIGS. 5 and 10, the buffer part 300 may comprise a elastic ring 310 and a plurality of springs 320. As shown in FIG. 5, there are provided a plurality of mounting holes 124 on the upper surface along the edge of the peripheral part 122 of the probe holding portion 120. FIG. 8 illustrates, in a perspective view, the plurality of mounting holes 212 of the upper holding block 210, which are used for mounting the springs. A plurality of springs 320 are mounted in the mounting holes 124, 212. As shown in FIGS. 7 and 9, the spring 320 is held between the upper holding block 210 and the peripheral part 122. In addition, on the peripheral part 122, the elastic ring 310 is located on the inner side of the spring 320, and between the upper holding block 210 and the peripheral part 122. According to the embodiment, the elastic ring 310 and the spring 320 function as an absorber to absorb the thrust applied to the probe head assembly in the Z direction during operation. It should be noted that the utility model is not limited thereto. The elastic ring 310 may also be located on the outer side of the spring 320. There is no limit to the number of the springs 320 in the present utility model. Its number can be determined according to the thrust applied onto the probe head assembly. In addition, the spring 320 may be a coil spring, or a leaf spring. The spring 320 may be a micro-spring, or other elastic components. In another embodiments, there may be one component, i.e., either an elastic ring 310 or springs 320. In yet another embodiments, the tangent probe card can dispense with the buffer part 300. Alternatively, the buffer part can be disposed on the outside of the tangent probe card, which may as well function as a buffer since it may absorb impulse of the whole tangent probe card.

As compared with the conventional probe card as shown in FIG. 1, the tangent probe card according to the embodiment has a flat testing end, the diameter of which is usually greater than that of the test target (i.e., the contact surface of the test target). Therefore, the allowable alignment budget is usually more generous for the tangent probe card. In addition, the tangent probe is held on the probe holding portion of the probe head assembly. In this way, once the alignment is achieved accurately during manufacture, the alignment will remain stable in the whole life cycle. In addition, as compared to the conventional pointed probes as shown in FIG. 1, the tangent probe has a larger CCC (current carrying capacity) due to its larger circular cross section. In this way, as to the test target of the same size, CCC of the tangent probe is greater than that of the conventional probe card. In addition, the throughput of the tangent probe card according to the utility model is higher than that of the conventional vertical probe cards or MEMS probe cards due to the fact that there is no need to move the pointed pin/structure. Furthermore, since the tangent probe card has no pointed pin/structure to be repaired, and the flat bottom surface of the probe head assembly is easier to clean and maintain, the maintenance and repair frequency thereof is decreased, leading to a lower cost.

Second Embodiment

Figure 11:
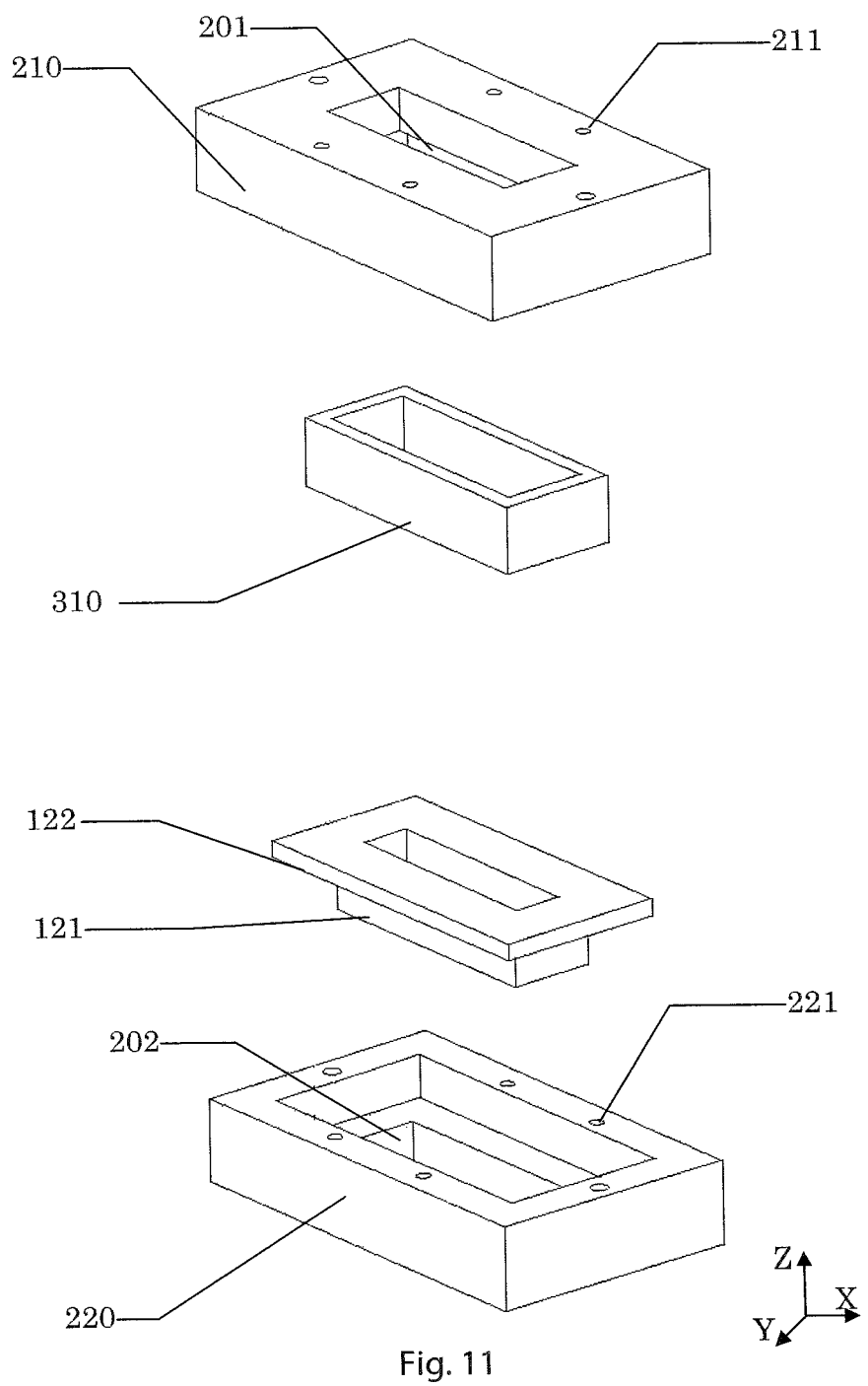
FIG. 11 is a perspective exploded view illustrating the second embodiment of the tangent probe card according to the utility model, where the plurality of probes are omitted for the sake of brevity.
Figure 12:
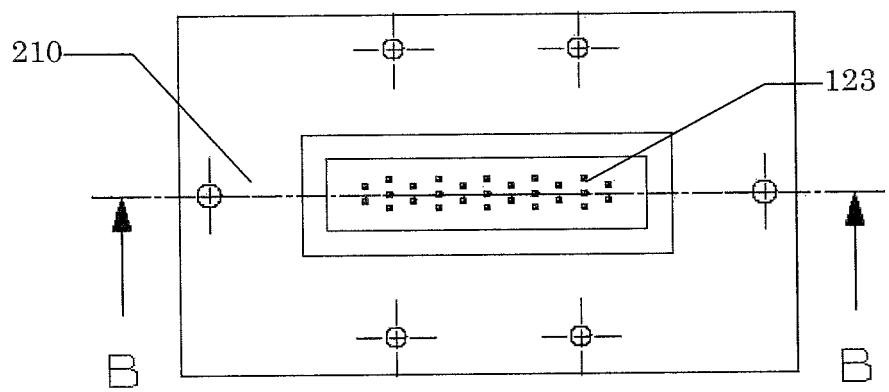
FIG. 12 is a top view of the tangent probe card according to the second embodiment.
Figure 13:
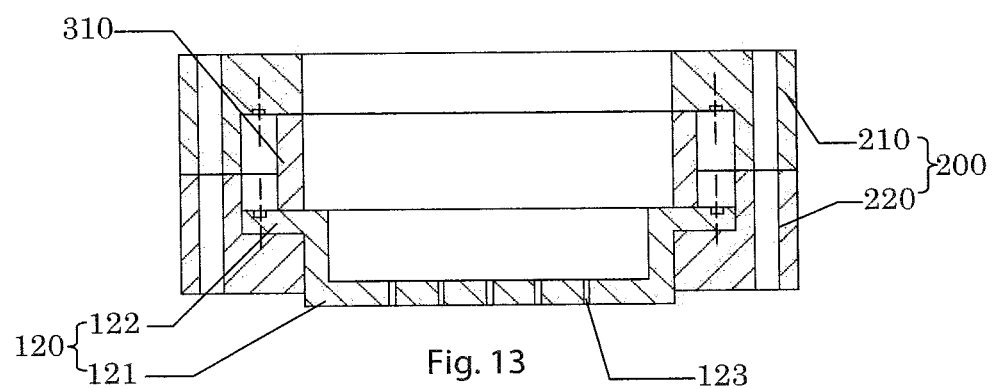
FIG. 13 is a cross-sectional view taken along the line B-B in FIG. 12.

FIG. 11 is a perspective exploded view of the second embodiment of the tangent probe card according to the utility model, where the plurality of probes are omitted for the sake of brevity. FIG. 12 is a top view of the tangent probe card according to the second embodiment. FIG. 13 is a cross-sectional view taken along the line B-B in FIG. 12.

The second embodiment differs from the first embodiment in the fact that the buffer part 300 comprises an elastic ring only. In other words, the tangent probe card according to the second embodiment is not provided with a spring 320. The second embodiment will be detailedly described hereinafter.

In the second embodiment, the tangent probe card may comprise a probe head assembly with a probe holding portion 120, a holder 200 and an elastic ring 310. For the sake of clarity, the probes are not depicted in FIGS. 11-13. However, the probe head assembly may comprise a plurality of probes according to the above-mentioned embodiments. The structure of the probe head assembly is the same as described in the above-mentioned embodiments, and hence description thereof is omitted.

In the second embodiment, the holder 200 is configured as a rectangular parallelepiped structure by means of an upper holding block 210 and a lower holding block 220. Of course, the skilled in the art should appreciate that the holder 200 is not limited to a rectangular parallelepiped shape, it may be of other shapes, such as a square shape, or a cylindrical shape. The upper holding block 210 is open on the bottom thereof, and is provided with a top opening 201 at the center of the top thereof. The lower holding block 220 is open on the top thereof, and is provided with a bottom opening 202 at the center of the bottom thereof. Thus, an inner space for holding the probe head assembly is defined by means of the engagement of the upper holding block 210 and the lower holding block 220. The bottom opening 202 allows the probes of the probe head assembly to contact with the test target. The top opening 201 allows the probes of the probe head assembly to electrically connect to the tester. As described above, the upper holding block 210 and the lower holding block 220 are fixed by inserting a screw into the upper fixing holes 211 and the lower fixing holes 221. As shown in FIGS. 11 and 13, the inner space of the holder 200 matches the peripheral part 122 of the probe holding portion 120. Specifically, the profile shape of the peripheral part 122 substantially matches that of the inner space of the holder 200. That is, the length and the width of the inner space are sized such that that the peripheral part 122 can be accommodated therein exactly, and the bottom surface of the peripheral part 122 abuts against the upper surface of the bottom of the lower holding block 220 of the holder 200. Meanwhile, the profile shape of the main body part 121 matches that of the bottom opening 202 of the holder 200. The length and the width of the bottom opening are sized such that the main body part 121 can be accommodated in the bottom opening 202 exactly. In this way, the holder 200 prevents the probe holding portion 120 and the probe from moving in the X and Y directions. Meanwhile, the height of the inner space of the holder 200, that is, its size in the Z direction, is greater than the thickness of the probe holding portion 120, such that the probe holding portion 120 and the probe may move in the Z direction in the inner space. Therefore, the probe head assembly 100 may move in the Z direction during probing, such that the testing end 111 on the bottom thereof may contact or separate from the wafer surface (e.g., the Cu pillar 400). In this way, the wafer testing is carried out. The skilled in the field should appreciate that the shapes or the sizes of the probe holding portion and the holder are not limited to the above-mentioned embodiments. Any configuration in which the probe holding portion (or the probe head assembly) is allowed to move in the Z direction and is not allowed to move in the X and Y directions is applicable to the present utility model.

In the second embodiment 2, as shown in FIGS. 11 and 13, the elastic ring 310 is provided along the peripheral part 122, and is located between the upper holding block 210 and the peripheral part 122. The elastic ring 310 functions as an absorber to absorb the thrust applied onto the probe head assembly in the Z direction during operations. As compared to the first embodiment, the tangent probe card has a more simply structure in which only the elastic ring 310 is utilized as an absorber. Therefore, in addition to the advantages of the first embodiment, the structure according to the second embodiment can lower the cost, reduce the manufacture time, and increase the production efficiency.

Third Embodiment

Figure 14:
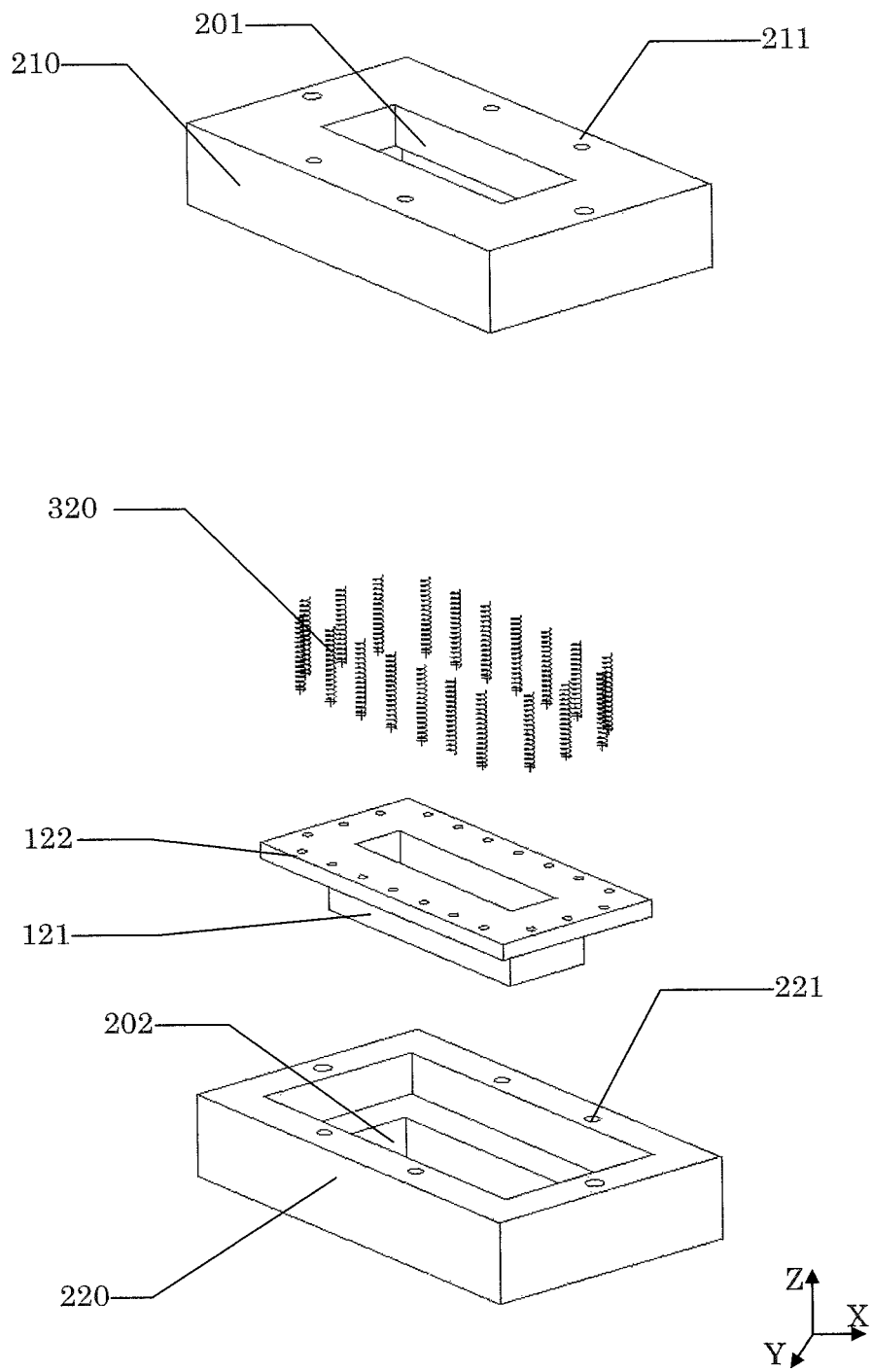
FIG. 14 is a perspective exploded view illustrating the third embodiment of the tangent probe card according to the utility model, where the plurality of probes are omitted for the sake of brevity.
Figure 15:
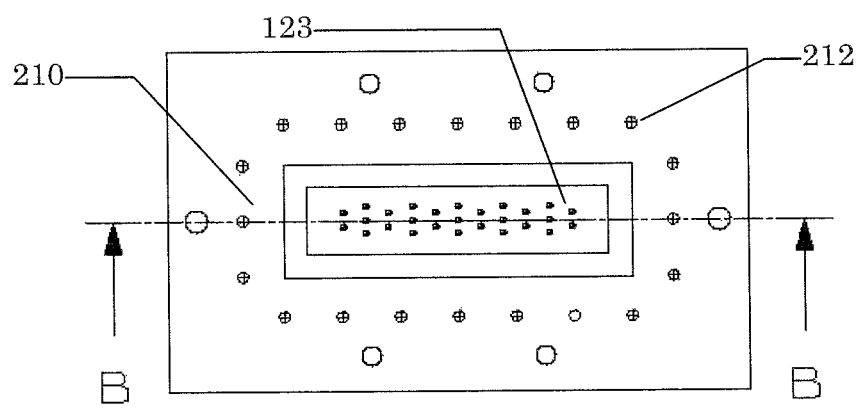
FIG. 15 is a top view of the tangent probe card according to the third embodiment.
Figure 16:
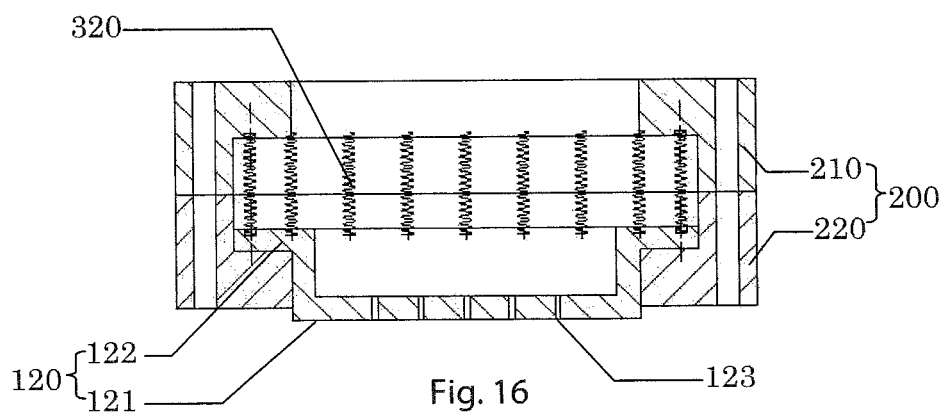
FIG. 16 is a cross-sectional view taken along the line B-B in FIG. 15.

FIG. 14 is a perspective exploded view illustrating the third embodiment of the tangent probe card according to the utility model, where the plurality of probes are omitted for the sake of brevity. FIG. 15 is a top view of the tangent probe card according to the third embodiment, wherein the mounting hole of the upper holding block that is used for mounting the spring is illustrated in a perspective view so as to show the location of the spring in the upper holding block. FIG. 16 is a cross-sectional view taken along the line B-B in FIG. 15.

The third embodiment 3 differs from the first embodiment in the fact that the buffer part 300 comprises the springs only. In other words, the tangent probe card according to the third embodiment is not provided with an elastic ring 310. The tangent probe card according to the third embodiment will be detailedly described hereinafter.

In the third embodiment, the tangent probe card may comprise a probe head assembly with a probe holding portion 120, a holder 200 and springs 310. For the sake of clarity, the probes are not depicted in FIGS. 14-16. However, the probe head assembly may comprise a plurality of probes according to the above-mentioned embodiments. The structure of the probe head assembly is the same as described in the above-mentioned embodiments, and hence description thereof is omitted.

In the third embodiment, the holder 200 mainly comprises an upper holding block 210 and a lower holding block 220. The upper holding block 210 has a top opening 201 at the top center, and is completely open on the bottom. The lower holding block 220 has a bottom opening 202 at the bottom center, and is completely open on the top. Thus, the upper holding block 210 and the lower holding block 220 define an inner space for accommodating the probe head assembly. The bottom opening 202 allows the probes of the probe head assembly to contact with the test target. The top opening 201 allows the probes of the probe head assembly to electrically connect to the tester. As described above, the upper holding block 210 and the lower holding block 220 are fixed by inserting a screw into the upper fixing holes 211 and the lower fixing holes 221. As shown in FIGS. 14 and 16, the inner space of the holder 200 matches the peripheral part 122 of the probe holding portion 120. Specifically, the profile shape of the peripheral part 122 substantially matches that of the inner space of the holder 200. That is, the length and the width of the inner space are sized such that the peripheral part 122 can be accommodated therein exactly, and the bottom surface of the peripheral part 122 abuts against the upper surface of the bottom of the lower holding block 220 of the holder 200. Meanwhile, the profile shape of the main body part 121 substantially matches that of the bottom opening of the holder 200. The length and the width of the bottom opening are sized such that the main body part 121 can be accommodated in the bottom opening exactly. In this way, the holder 200 prevents the probe holding portion 120 and the probe from moving in the X and Y directions. Meanwhile, the height of the inner space of the holder 200, that is, its size in the Z direction, is greater than the thickness of the probe holding portion 120, such that the probe holding portion 120 and the probe may move in the Z direction in the inner space. Therefore, the probe head assembly 100 may move in the Z direction during probing, such that the testing end 111 on the bottom thereof may contact or separate from the wafer surface (e.g., the Cu pillar 400). In this way, the wafer testing is carried out. The skilled in the field should appreciate that the shapes or the sizes of the probe holding portion and the holder are not limited to the above-mentioned embodiments. Any configuration in which the probe holding portion (or the probe head assembly) is allowed to move in the Z direction and is not allowed to move in the X and Y directions is applicable to the present utility model.

In the third embodiment, as shown in FIGS. 14, 15 and 16, the springs 320 are provided along the peripheral part 122, and are located between the upper holding block 210 and the peripheral part 122. Specifically, as shown in FIG. 15, there are provided with a plurality of mounting holes 124 on the upper surface along the edge of the peripheral part 122 of the probe holder 120. As shown in FIG. 15, the upper holding block 210 is provided with a plurality of mounting holes 212 corresponding to the plurality of mounting holes 124. As shown in FIG. 16, one ends of the plurality of springs 320 are mounted into the mounting holes 124, the other ends of which are mounted into the mounting holes 212. In this way, the plurality of springs 320 are disposed between the upper holding block 210 and the peripheral part 122. Furthermore, the number of the springs can be determined according to the thrust applied onto the probe head assembly.

The springs 320 can function as an absorber to absorb the thrust applied onto the probe head assembly in the Z direction during operations. As compared to the first embodiment, the tangent probe card has a more simply structure in which only the springs 320 are utilized as an absorber. Therefore, in addition to the advantages of the first embodiment, the structure according to the third embodiment can lower the cost, reduce the manufacture time, and increase the production efficiency.

In addition, in other embodiments according to the utility model, the main body part of the probe holding portion has no opening on the top side thereof, but instead, similar to the bottom, it has through-holes for the plurality of probe to run through. In this way, the peripheral part may be dispensed with. In this situation, the elastic ring or springs may be disposed between the top of the main body part of the probe holding portion and the top of the upper holding block.

A Testing System

Figure 17:
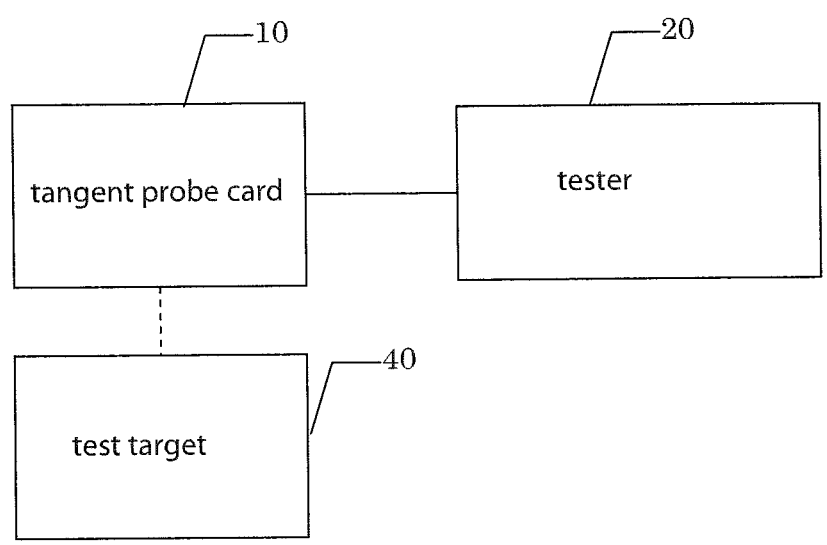
FIG. 17 is a block diagram illustrating the system for semiconductor wafer testing according to the utility model.

FIG. 17 is a block diagram illustrating the system for semiconductor wafer testing according to the utility model. A system for semiconductor wafer testing according to the embodiments of the utility model may comprise a tangent probe card 10, and a tester 20 which is electrically connected to the tangent probe card 10. The tangent probe card 10 is used to contact and test the test target 10. The tester 20 is used to determine the electrical characteristics of the test target 40 based on the electrical signals probed by the tangent probe card 10. In the said system, the tangent probe card according to any of above-mentioned first to third embodiments is applicable. The tangent probe card can use the probe head assembly as described in the above-mentioned embodiments, which probe head assembly comprises a plurality of probes, one ends of which are testing ends, and the other ends of which are connecting ends, with the testing end being flat; a probe holding portion, which holds the plurality of probes at the prescribed locations, and makes the testing ends of the plurality of probes be flush with the bottom surface of the probe holding portion. In this way, the structures of the tangent probe card and the probe head assembly are referred to the above-mentioned embodiments, and hence descriptions thereof are omitted. Based on the said tangent probe card and the probe head assembly, the testing system according to the utility model can solve the above-mentioned challenges confronted with the traditional probe card of the conventional testing system.

The terms and phrases presented in the description of the utility model are only for the purpose of illustration, and hence should not be appreciated as limits. The skilled in the art should appreciate that the details in the above-mentioned embodiments can be modified in various ways, without departing from the basic principle of the disclosed embodiments. For example, the tangent probe card according to the embodiments as shown in the accompanying figures of the description of the utility model is rectangular parallelepiped shape; however, the utility model is not limited thereto. The tangent probe card of different shapes may be applicable, such as a cylindrical shape, or an oval shape. Therefore, the scope of the utility model is defined only by the claims. In the claims, all the terms should be understood in their broadest reasonable sense, unless otherwise noted.

What is claimed is:

1. A probe head assembly for a tangent probe card, wherein the probe head assembly comprises:
   a plurality of probes, a first end of each of which is a testing end and a second end of each of which is a connecting end, with the testing ends being flat, the connecting end of each of the plurality of probes being configured to electrically connect to a tester by a conductive wire such that the probe head assembly will hang from and be suspended by the conductive wires; and
   a probe holding portion, which holds the plurality of probes at prescribed locations and makes the testing ends of the plurality of probes be flush with a bottom surface of the probe holding portion, the plurality of probes being permanently connected to the probe holding portion,
   wherein the probe head assembly is carried by a holder, the holder being mounted in a fixed position such that the holder does not interact directly with a test target,
   wherein a buffer part is located between the probe head assembly and a top of the holder to adjust a contact force between the testing ends and the test target during testing, and
   wherein the probe head assembly is configured to move upward and downward when the test target is moved up and down during testing.

2. The probe head assembly according to claim 1, wherein said probe holding portion comprises:
   a main body part, which is provided with a cavity for the plurality of probes to run through.

3. The probe head assembly according to claim 2, wherein said probe holding portion further comprises:
   a peripheral part, which is located at a top edge of the main body part and is connected to the main body part.

4. The probe head assembly according to claim 2, wherein the main body part is provided with a plurality of through-holes on a bottom of the main body part, and
   wherein the testing ends of the plurality of probes extend into the plurality of through-holes, and the said testing ends are flush with the bottom surface of the main body part.

5. The probe head assembly according to claim 3, wherein the peripheral part and the main body part are bonded together via welding or an adhesive.

6. The probe head assembly according to claim 3, wherein the peripheral part and the main body part are molded into one piece.

7. A tangent probe card, comprising:
   a probe head assembly, the probe head assembly comprising:
      a plurality of probes, a first end of each of which is a testing end and a second end of each of which is a connecting end, with the testing ends being flat, the connecting end of each of the plurality of probes being configured to electrically connect to a tester by a conductive wire such that the probe head assembly will hang from and be suspended by the conductive wires; and
      a probe holding portion, which holds the plurality of probes at prescribed locations and makes the testing ends of the plurality of probes be flush with a bottom surface of the probe holding portion, the plurality of probes being permanently connected to the probe holding portion;
   a holder, for carrying the probe head assembly, the holder being mounted in a fixed position such that the holder does not interact directly with a test target; and
   a buffer part located between the probe head assembly and the top of the holder to adjust a contact force between the testing ends and the test target during testing,
   wherein the probe head assembly is configured to move upward and downward when the test target is moved up and down during testing.

8. The tangent probe card according to claim 7, wherein the probe holding portion comprises:
   a main body part, which is provided with a cavity for the plurality of probes to run through.

9. The tangent probe card according to claim 8, wherein said probe holding portion further comprises:
   a peripheral part, which is located at a top edge of the main body part and is connected to the main body part.

10. The tangent probe card according to claim 8, wherein the main body part is provided with a plurality of through-holes on a bottom of the main body part, and wherein the testing ends of the plurality of probes extend into the plurality of through-holes, and said testing ends are flush with the bottom surface of the main body part.

11. The tangent probe card according to claim 9, wherein the holder has an inner space for accommodating the probe head assembly, a bottom opening which allows the probe head assembly to contact the test target, and a top opening which allows the connecting ends of the plurality of probes to connect the tester electrically.

12. The tangent probe card according to claim 11, wherein the inner space of the holder is sized such that the probe head assembly is allowed to move in the vertical direction, but not allowed to move in the horizontal direction.

13. The tangent probe card according to claim 11, wherein the peripheral part of the probe holding portion matches the inner space of the holder, and the main body part matches the bottom opening of the holder, such that the probe head assembly can move in the vertical direction, and is prevented from moving in the horizontal direction.

14. The tangent probe card according to claim 13, wherein the holder comprises an upper holding block with the top opening, and a lower holding block with the bottom opening, and wherein the upper holding block and the lower holding block define the inner space of the holder.

15. The tangent probe card according to claim 14, wherein the buffer part comprises an elastic ring, which is disposed between the probe holding portion and the upper holding block along the peripheral part of the probe holding portion.

16. The tangent probe card according to claim 14, wherein the buffer part comprises a plurality of springs, which are disposed between the probe holding portion and the upper holding block along the peripheral part of the probe holding portion.

17. The tangent probe card according to claim 7, wherein each of the probes are a part of each of the conductive wires which are electrically connected to the tester.

18. A system for semiconductor wafer testing, wherein the system comprises:

the tangent probe card according to claim 7, for contacting and testing the test target; and tester, which is electrically connected to the tangent probe card and functions to determine the electrical characteristics of the test target according to the electrical signals detected by the tangent probe card.

19. The tangent probe card according to claim 16, wherein the testing end and the connecting end of the plurality of probes is not connected to the elastic ring.

* * * * *